(12) United States Patent
Jacob et al.

(10) Patent No.: US 7,543,102 B2
(45) Date of Patent: Jun. 2, 2009

(54) SYSTEM AND METHOD FOR PERFORMING MULTI-RANK COMMAND SCHEDULING IN DDR SDRAM MEMORY SYSTEMS

(75) Inventors: Bruce L. Jacob, Laurel, MD (US); David Tawei Wang, Gaithersburg, MD (US)

(73) Assignee: University of Maryland, College Park, MD (US)

( * ) Notice: Subject to any disclaimer, the term of this patent is extended or adjusted under 35 U.S.C. 154(b) by 168 days.

(21) Appl. No.: 11/405,617

(22) Filed: Apr. 17, 2006

(65) Prior Publication Data
US 2006/0248261 A1 Nov. 2, 2006

Related U.S. Application Data

(60) Provisional application No. 60/672,364, filed on Apr. 18, 2005.

(51) Int. Cl.
*G06G 12/12* (2006.01)
(52) U.S. Cl. ......................................... 711/5
(58) Field of Classification Search ....................... 711/5
See application file for complete search history.

(56) References Cited

U.S. PATENT DOCUMENTS

2005/0091460 A1* 4/2005 Rotithor et al. ............. 711/158

OTHER PUBLICATIONS

S. Rixner, "Memory Controller Optimizations for Web Servers", Proceedings of the 37th International Symposium on Microarchitecture, Dec. 2004.
S. Moyer, "Access Ordering and Effective Memory Bandwidth", doctoral thesis, Dept. of Computer Science, Univeristy of Virginia, Apr. 5, 1993.
S. Rixner et al., "Memory Access Scheduling", Proceedings 27th annual international symposium on Computer Architecture (ISCA 2000).
S. A. McKee et al., "Dynamic Access Ordering for Streamed Computations", IEEE Transactions on Computers, vol. 49, No. 11, Nov. 2000, pp. 1255-1271.
C. Zhang, S. McKee, "Hardware-Only Stream Prefetching and Dynamic Access Ordering", Proceedings 27th annual international symposium on Computer Architecture (ISCA 2000).
C. A. MacKinnon, "Chipsets, Processors & Memory", Processor, vol. 27, Issue 6, p. 18 (Feb. 11, 2005).

* cited by examiner

*Primary Examiner*—Hyung S Sough
*Assistant Examiner*—Hamdy S Ahmed
(74) *Attorney, Agent, or Firm*—Carter, DeLuca, Farrell & Schmidt, LLP (57) ABSTRACT

A DRAM command scheduling algorithm is presented that is designed to alleviate various constraints imposed upon high performance, high datarate, short channel DDRx SDRAM memory systems. The algorithm amortizes the overhead costs of rank-switching time and schedules around the $t_{FAW}$ bank activation constraint. A multi-rank DDRx memory system is also presented having at least two ranks of memory each having a number of banks and at least one memory controller configured for performing the hardware-implemented step of DRAM command scheduling for row access commands and column access commands. The step of command scheduling includes decoupling the row access commands from the column access commands; alternatively scheduling the decoupled row access commands to different ranks of memory; and group scheduling the decoupled column access commands to each bank of the number of banks of a given rank of the different ranks of memory.

17 Claims, 5 Drawing Sheets

FIG. 4B r: RAS
c: CAS + PREC

```
cmd       cr cr cr cr cr cr cr cr cr cr cr cr cr cr cr cr
Rank ID   0 0 1 0 0 0 1 0 0 0 1 0 0 1 1 1 0 1 1 1 0 1 1 1
Bank ID   4 0 0 1 5 2 1 3 6 4 2 5 7 6 3 7 0 0 4 1 1 2 5 3 2 4 6 5 3 6 7 7
```
Sequence for 8 Bank Device

```
cmd       cr cr cr cr cr cr cr cr cr cr cr cr cr cr cr cr cr cr cr cr cr cr cr cr cr cr cr cr cr cr cr cr
Rank ID   0 0 1 0 0 0 1 0 0 0 1 0 0 0 1 0 0 0 1 0 0 1 1 1 0 1 1 1 0 1 1 1 0 1 1 1 0 1 1 1 0 1 1 1 0 1 1 1
Bank ID   8 0 0 1 9 2 1 3 A 4 2 5 B 6 3 7 C 8 4 9 D A 5 B E C 5 D F E 7 F 0 0 8 1 1 2 9 3 2 4 A 5 3 6 B 7 4 8 C 9 5 A D B 6 C E D 7 E F F
```
Sequence for 16 Bank Device

FIG. 5

SYSTEM AND METHOD FOR PERFORMING MULTI-RANK COMMAND SCHEDULING IN DDR SDRAM MEMORY SYSTEMS

PRIORITY

This application claims priority from a United States Provisional Application filed on Apr. 18, 2005 and assigned U.S. Provisional Application Ser. No. 60/672,364; the entire contents of which are incorporated herein by reference.

BACKGROUND

1. Technical Field

The disclosure relates to DRAM memory systems. In particular, the disclosure relates to command scheduling in DDR SDRAM memory systems.

2. Description of the Prior Art

The primary goal in the design of high performance memory systems is to obtain maximum bandwidth with low request access latencies. However, constraints such as data bus synchronization overhead in DDRx SDRAM devices memory systems, where x is an integer greater than or equal to two, and constraints that limit peak power in DDR2 and DDR3 devices will significantly impact sustainable bandwidth in high performance DDRx SDRAM memory systems. Moreover, while DRAM device datarate increases with each new generation of DDRx SDRAM devices at the rate of 100% every three years, DRAM row cycle times are only decreasing at a rate of 7% per year. Collectively, these trends increase the difficulty of achieving maximum sustainable bandwidth from each successive generation of higher datarate DDRx SDRAM devices by increasing the ratio of DRAM row cycle time to data transport time. Previous studies have recognized and examined the importance of DRAM access scheduling but do not address the issue of data bus synchronization and power limiting constraints in DDRx SDRAM memory systems.

Previous work in the area of DRAM command scheduling examines the impact of data bus synchronization overhead, write-to-read turnaround times and row-to-row activation times, but does not address the four-bank-activation window limitation of $t_{FAW}$, nor do any previous studies offer specific algorithms that deal with the conflicting requirements of these different overheads.

SUMMARY

The present disclosure provides a memory transaction and DRAM command scheduling algorithm that enables a multi-rank DDRx SDRAM memory system in accordance with the present disclosure to achieve optimal bandwidth utilization while fully respecting the timing constraints imposed on the DDRx SDRAM memory system by $t_{FAW}$, $t_{RRD}$ and $t_{RTRS}$. $t_{RTRS}$ is a timing parameter that represents the data strobe signal hand-off time. The single parameter $t_{RTRS}$ accounts for data strobe post-amble time $t_{RPST}$ and the data strobe pre-amble time $t_{RPRE}$. The timing parameters $t_{FAW}$, $t_{RRD}$, $t_{RPST}$ and $t_{RPRE}$ are industry standard timing parameters that can be found in DRAM device datasheets. The DRAM transaction and command ordering algorithm according to the present disclosure selects pending memory transactions based on DRAM bank and rank addresses, then sequences the DRAM row activation and column access commands in a specific ordering to minimize the bandwidth impact imposed on the DRAM memory system by $t_{FAW}$, $t_{RRD}$ and $t_{RTRS}$.

For example, in a DDR3 SDRAM memory system with a 64 bit wide data bus that operates at 1 Gbps, the DRAM transaction and command ordering algorithm according to the present disclosure increases the maximum sustainable bandwidth by 41% above a moderately intelligent memory system that implements a round robin bank rotation scheduling algorithm. Simulations show that the aggressive DRAM transaction and command ordering algorithm according to the present disclosure could potentially increase the performance of bandwidth intensive workloads up to 40% when compared against a round-robin bank-rotation scheduling algorithm that does not account for the bandwidth impact of $t_{FAW}$, $t_{RRD}$ and $t_{RTRS}$.

In particular, the algorithm in accordance with the present disclosure is configured for being executed by at least one memory controller for performing the method of command scheduling for row access commands and column access commands in a multi-rank DDRx memory system having at least two ranks of memory, with each rank having a number of banks. The method includes decoupling the row access commands from the column access commands; alternatively scheduling the decoupled row access commands to different ranks of memory; and group scheduling the decoupled column access commands to each bank of the number of banks of a given rank of at least two ranks of memory.

BRIEF DESCRIPTION OF THE FIGURES

These and other advantages will become more apparent from the following detailed description of the various embodiments of the present disclosure with reference to the figures wherein.

DETAILED DESCRIPTION OF THE PREFERRED EMBODIMENTS

To design a high performance DDRx SDRAM memory controller in accordance with the principles of the present disclosure, the issue of memory access scheduling is first discussed to address the constraints imposed on DDR2 and DDR3 SDRAM memory systems by the data bus synchronization overhead of $t_{RTRS}$ and peak power limiting timing parameters $t_{FAW}$ and $t_{RRD}$. $t_{RTRS}$ is a timing parameter that represents the data strobe signal hand-off time. The single parameter $t_{RTRS}$ accounts for data strobe post-amble time $t_{RPST}$ and the data strobe pre-amble time $t_{RPRE}$. The timing parameters $t_{FAW}$, $t_{RRD}$, $t_{RPST}$ and $t_{RPRE}$ are industry standard timing parameters that can be found in DRAM device datasheets. Following the discussion of memory access scheduling, the DRAM transaction and command scheduling algorithm according to the present disclosure is described, and the maximum sustainable bandwidth of the algorithm is illustrated.

A. Preliminary Information

A.1. Row Buffer Management Policy

Previous studies have shown that single-threaded workloads benefit well from an open-page row buffer management policy and that $t_{FAW}$ impacts are relatively minor compared to that of a close-page memory system. However, the impact of $t_{FAW}$ grows worse with relatively constant row cycle times and increasing data rates in both open-page and close-page systems and $t_{FAW}$ greatly limits the performance of close-page memory systems. Moreover, the significance of close-page memory systems is increasing with the emergence of multi-threaded and multi-core processors. In the present study, the goal is to examine a scheduling algorithm that facilitates the extraction of maximum bandwidth in $t_{FAW}$ limited, close-page memory systems. The rationale for the focus on close-page memory systems in this study is that the impact of $t_{FAW}$ on close-page memory systems is immediate and extreme. As a result, the scheduling algorithm according to the present disclosure is specifically targeted for close-page memory systems to alleviate the impact of the $t_{FAW}$ bank activation window in DDRx SDRAM memory systems. It is envisioned that the algorithm according to the present disclosure can be extended to the less-affected open-page memory systems.

A.2. Timing Parameters

The timing parameters used in this part of the study and the projected values for a 1 Gbps (500 MHz) DDR3 SDRAM memory system are summarized in Table 1. The values for the timing parameters in Table 1 are projected from presently available 667 Mbps (333 MHz, dual datarate) DDR2 devices. They are used for illustrative purposes and are not to be taken as concrete device parameter values for 1 Gbps DDR3 devices.

TABLE 1

Summary of timing parameters

| Parameter | Description | Value in example |
|---|---|---|
| $t_{Burst}$ | Data Burst duration. Time period that data burst occupies on the data bus. Typically 4 or 8 beats of data. In DDR SDRAM, 4 beats of data occupies 2 full cycles. Also known as $t_{BL}$. | 8 ns |
| $t_{CAS}$ | Column Access Strobe latency. Time interval between column access command and data return by DRAM device(s). Also known as $t_{CL}$. | 10 ns |
| $t_{CMD}$ | Command transport duration. Time period that a command occupies on the command bus as it is transported from the DRAM controller to the DRAM devices. | 2 ns |
| $t_{CWD}$ | Column Write Delay. Time interval between issuance of column write command and placement of data on data bus by the DRAM controller. | 8 ns |
| $t_{RTRS}$ | Rank-To-Rank-Switching time. Used in DDR, DDR2, and DDR3 memory systems. Not needed or used in SDRAM memory systems. This timing parameter effectively accounts for the pre-amble and post-amble times needed by the DQS strobe signals. 1 full cycle in DDR SDRAM systems. 2 cycles assumed for the 1 Gbps DDR3 system illustrated herein. | 4 ns |
| $t_{FAW}$ | Four bank Activation Window. A rolling time frame in which a maximum of four bank activation may be engaged. Limits peak current profile in DDRx devices with more than 4 banks. | 48 ns |
| $t_{RAS}$ | Row Access Strobe. Time interval between row access command and data restoration in DRAM array. After tRAS, DRAM bank could be precharged. | 40 ns |
| $t_{RC}$ | Row Cycle. Time interval between accesses to different rows in same bank, $t_{RC} = t_{RAS} + t_{RP}$ | 50 ns |
| $t_{RCD}$ | Row to Column command Delay. Time interval between row access command and data ready at sense amplifiers. | 10 ns |
| $t_{RRD}$ | Row activation to Row activation Delay. Minimum time interval between two row activation commands to same DRAM device. Limits peak current profile. | 10 ns |
| $t_{RP}$ | Row Precharge. Time interval that it takes for a DRAM array to be precharged and readied for another row access. | 10 ns |
| $t_{WR}$ | Write Recovery time. Minimum time interval between end of write data burst and the start of a precharge command. Allows sense amplifiers to restore data to cells. | 12 ns |
| $t_{WTR}$ | Write To Read turnaround time. Minimum time interval between end of write data burst and the start of a column read command. Allows iW to Rtransition in internal DRAM datapath. | 10 ns |

A.3. Bank Activation Window Limited Memory System

To ensure that a commodity DDRx SDRAM device does not exceed a specified maximum power draw and to limit on-chip noise, timing parameters have been introduced to limit the power consumption characteristics in DDR2 and DDR3 devices with more than four banks per device. In DDRx SDRAM devices, $t_{RRD}$ and $t_{FAW}$ have been defined to specify the minimum time periods for row (bank) activations on a given DRAM device. The acronym RRD stands for row-to-row activation delay, and FAW stands for four bank activation window. The timing parameters $t_{RRD}$ and $t_{FAW}$ are specified in terms of nanoseconds, and FIG. 1 shows that by specifying $t_{RDD}$ and $t_{FAW}$ in terms of nanoseconds instead of number of cycles, the minimum spacing between row activation is maintained regardless of operating datarates: on a given DRAM device, row activations must be scheduled at least $t_{RRD}$ apart from each other, and within any $t_{FAW}$ time period, at most four row activations to four different banks can be engaged.

Figure 1:
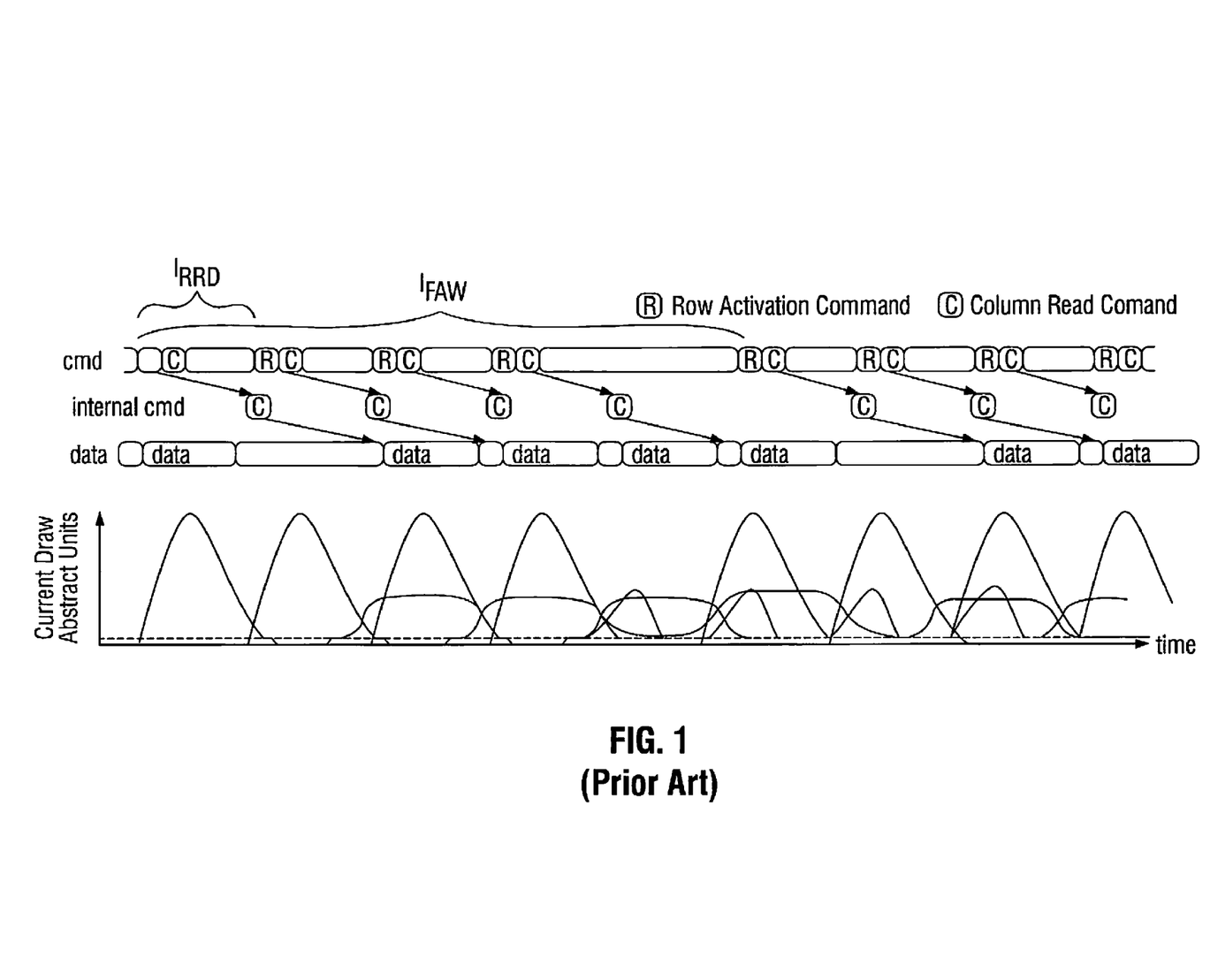
FIG. 1 illustrates a maximum of four row activations in any $t_{FAW}$ time frame according to a prior art memory scheduling algorithm.
Figure 2:
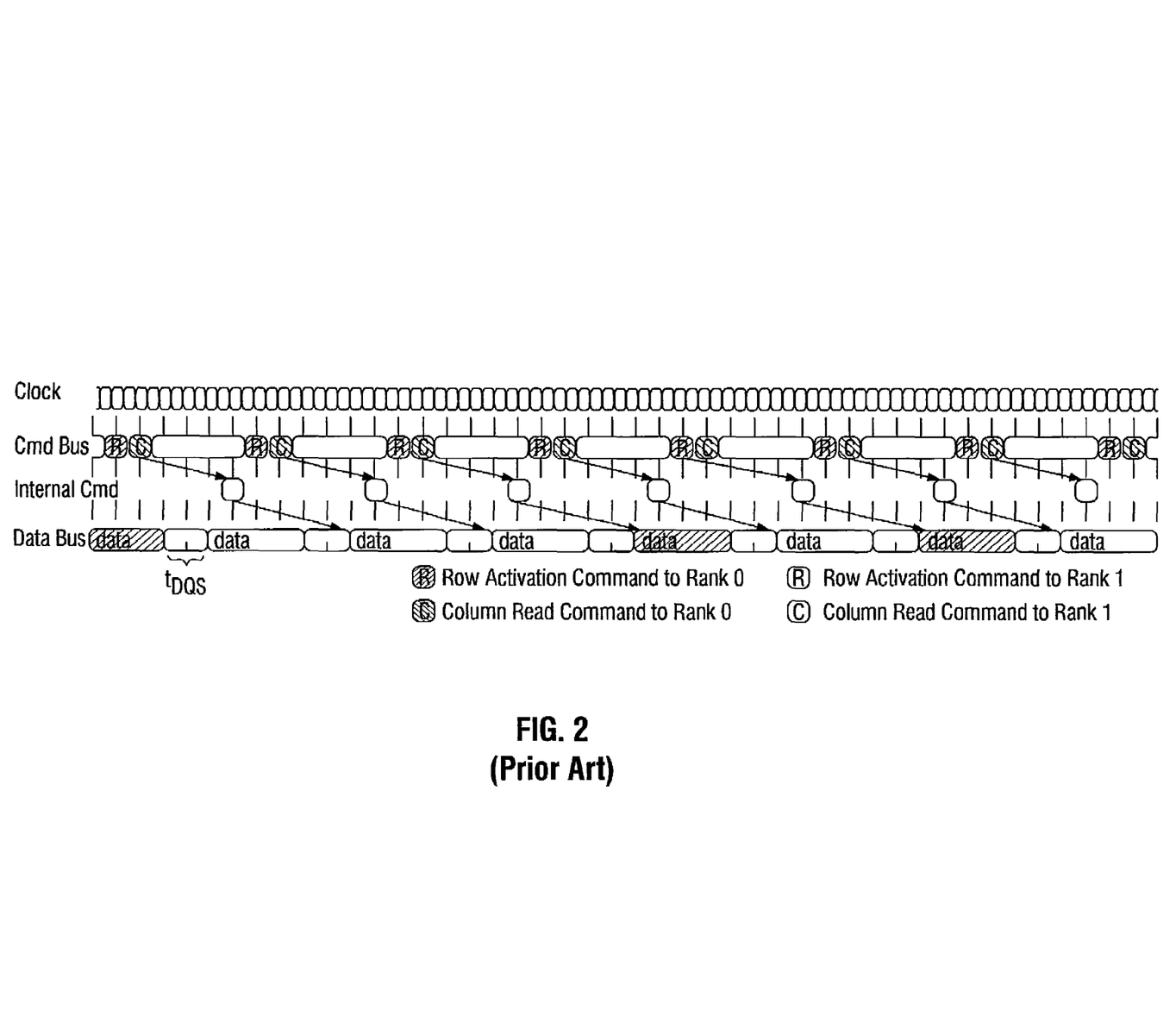
FIG. 2 illustrates a consecutive read command to alternate ranks in DDR3 SDRAM at 1 Gbps according to a prior art memory scheduling algorithm.

Precharge commands are not shown in the heavily pipelined timing diagrams of FIGS. 1 and 2 in order to simplify the timing diagrams. FIG. 1 illustrates a prior art algorithm that issues command in a bank round robin fashion that rotates through the per-bank queues in a given rank sequentially, then moves to the next rank, and FIG. 2 illustrates an alternative rank round robin prior art scheduling algorithm that rotates through per-bank queues by going through all of the rank id's for a given bank, then moves to the next bank.

In FIGS. 1 and 2, the precharge command is assumed to be issued via a column-access-and-precharge command. In open-page memory systems, the precharge command may be issued separately, but the scheduling algorithm described herein in accordance with the present disclosure does not change regardless of whether the precharge command is issued separately from the column-access command. Consequently, leaving the illustration of the precharge command out of the timing diagrams does not impact statements made in regards to the scheduling algorithm.

For close-page memory systems, $t_{RRD}$ and $t_{FAW}$ effectively limit the maximum sustainable bandwidth to each rank of memory, irrespective of device datarate. In this case, the maximum bandwidth efficiency of a single rank, $t_{FAW}$ limited close-page DRAM memory system is $(4*t_{Burst})/t_{FAW}$.

A.4. Consecutive Commands to Different Ranks: Data Bus Synchronization

In all modern DRAM memory systems, consecutive, full prefetch length, column-read commands or consecutive column-write commands to the same open row of the same bank or to different open rows of different banks of the same rank can be issued and pipelined consecutively. However, consecutive column-read commands to different ranks of memory cannot be pipelined consecutively in DDR, DDR2 and DDR3 SDRAM memory systems due to insertion of idle cycles on the data bus to ensure proper transfer of control of the source synchronous data strobe signals from one rank of DRAM devices to another. In the illustrated example, a 2 cycle, 4 ns switching time is specified for a hypothetical DDR3 SDRAM memory system that operates at 1 Gbps (500 MHz).

FIG. 2 illustrates the timing and command sequence of consecutive close-page read cycles to alternate ranks of DRAM devices. In FIG. 2, each DRAM access is translated to a row-activation command and a column access-and-precharge command. FIG. 2 illustrates that the minimum spacing of $t_{RTRS}$, the rank-to-rank switching time, is needed in between each pair of column-read commands to allow one rank of DRAM devices to release control of data strobe synchronization signals and for a different rank of DRAM devices to gain control of them. In this case, each column-read access incurs the rank switching overhead of $t_{RTRS}$, and the maximum sustainable bandwidth efficiency of a close-page memory system that alternates memory requests between two different ranks is $t_{Burst}/(t_{Burst}+t_{RTRS})$. The compound effects of $t_{RTRS}$ and $t_{FAW}$ ensure that neither a one-rank-at-a-time nor a simple alternate-rank hopping algorithm can sustain high bandwidth with ideally pipelined DRAM commands. In these cases, either the peak power limiting timing parameters or the rank-to-rank switching time will significantly impact maximum sustainable bandwidth characteristics.

B. Rank Hopping Scheduling Algorithm

In the previous section, respective maximum sustainable bandwidth efficiencies for a single rank DDRx memory system and a dual rank DDRx memory system that alternates memory accesses between the two ranks of memory were computed as $(4*t_{Burst})/t_{FAW}$ and $t_{Burst}/(t_{Burst}+t_{RTRS})$, respectively. Substituting in the projected values for timing parameters for the 1 Gbps DDR3 SDRAM device specified in Table 1, the maximum bandwidth efficiencies is 66.7% for both cases.

In contrast, the DRAM transaction and command scheduling algorithm according to the present disclosure amortizes the rank switching overhead and increases the maximum bandwidth efficiency for a dual rank memory system to $N*t_{Burst}/(N*t_{Burst}+t_{RTRS})$, where N denotes the number of banks in a given rank of DRAM devices. (It is noted that DDR2 devices larger than 1 Gbit and all DDR3 devices have eight banks internally. N is equal to eight for these devices. The bank count may be further increased in future DDRx devices.)

Substituting in the projected values for timing parameters as specified in Table 1, the scheduling algorithm according to the present disclosure increases the maximum sustainable bandwidth efficiency from 66.7% to 94%. The maximum bandwidth efficiency of 94% represents increases of 41% of additional bandwidth over the maximum bandwidth efficiencies of the baseline memory systems.

The key to increasing bandwidth efficiency of a multi-rank DDRx SDRAM memory system can be found through an examination of the respective constraints imposed on a DDRx SDRAM memory system by $t_{RTRS}$, $t_{RRD}$ and $t_{FAW}$. In a DDRx SDRAM memory system with a single rank of memory, row activations cannot be scheduled closely to each other because of $t_{RRD}$ and $t_{FAW}$, and a dual rank DDRx SDRAM memory system that alternates column access commands between different ranks incurs the rank switching overhead of $t_{RTRS}$ for each access. To minimize the bandwidth impact of $t_{RTRS}$, $t_{RRD}$ and $t_{FAW}$, a high performance DDRx SDRAM memory system must schedule row accesses to alternate ranks of memory to avoid the constraints of $t_{RRD}$ and $t_{FAW}$. Furthermore, to minimize the bandwidth impact of $t_{RTRS}$, a high performance DDRx SDRAM memory system must group schedule column-read commands to the same rank of memory for as long as possible. The solution to the bandwidth constraints imposed by $t_{RTRS}$, $t_{RRD}$ and $t_{FAW}$ in a high datarate DDRx SDRAM memory system is then a scheduling algorithm that decouples row access commands from column access commands, distributes row access commands to different ranks of memory to avoid incurring the constraints of $t_{RRD}$ and $t_{FAW}$, and group schedules column-read commands to a given rank of memory for as long as possible, thus amortizing the rank switching overhead of $t_{RTRS}$.

Figure 4A:
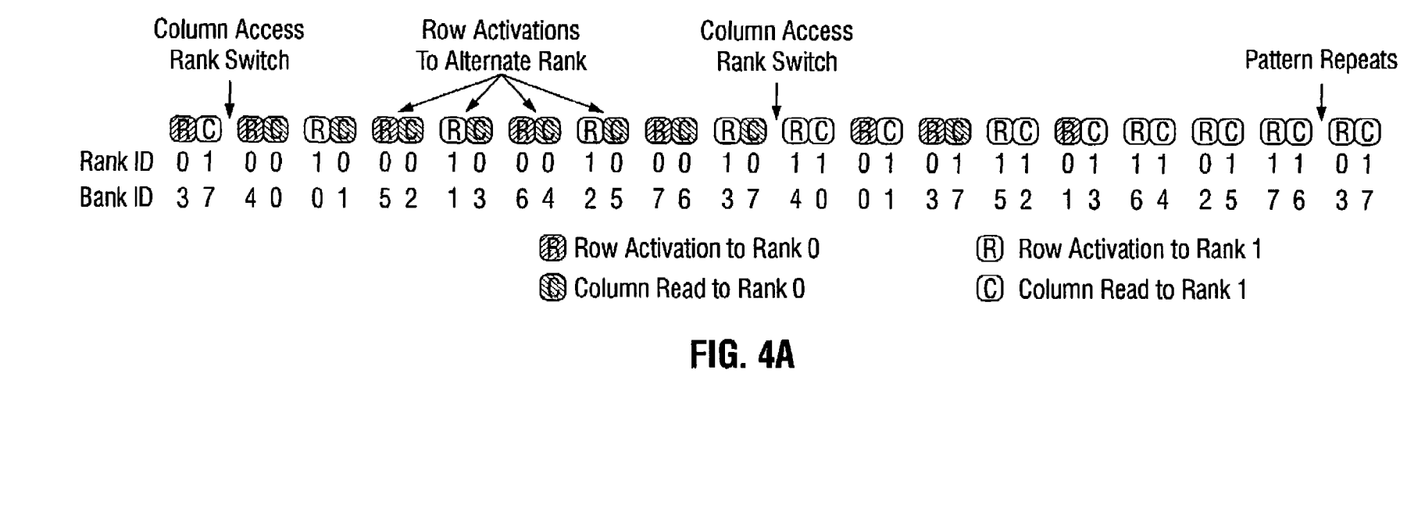
FIG. 4a illustrates row and column command sequences in a rank hopping algorithm in accordance with the present disclosure.
Figure 4B:
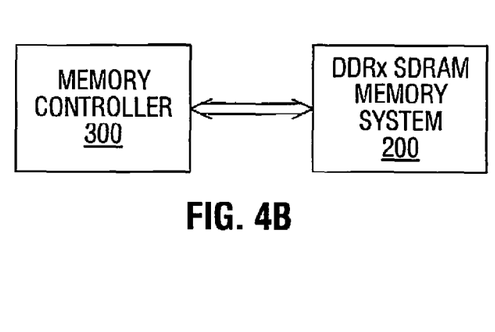
FIG. 4b is a block diagram of a processor associated with a DDRx SDRAM memory system in accordance with the present disclosure.

The algorithm according to the present disclosure determines how long it is possible to group schedule column access commands to a given rank of memory by queuing requests from processors to the memory system in each of the per-bank queues in the memory controller 300 (FIG. 4b). The ordering within each per-bank queue is respected, and no re-ordering occurs within each per-bank queue, but column access commands are freely re-ordered between different banks.

The algorithm according to the present disclosure then alternates between each rank, picking out row access commands to schedule. As it picks a row access command from a given per-bank queue, the column access command behind that row access command becomes the command on top of that per-bank queue. As the scheduling algorithm picks through the row access commands from one rank, eventually all N banks in that rank will have a column access command on top (a queue can be empty if there are no pending requests to that bank). Then, as the algorithm comes around to do group scheduling of the column accesses, it can grab as many as N column accesses; one from the top of each queue, assuming that there are no empty queues. After the group scheduling of the column access is complete, then all of the queues will have a row access command on top of them again (one or more queues can be empty). It is noted that open-page memory systems will have more column accesses per row access, so the algorithm can stay on the same ranks for as long as there are column access commands in any bank of that rank.

The command-pair rank hopping (CPRH) memory transaction re-ordering and DRAM command scheduling algorithm described herein in accordance with the present disclosure alleviates the impacts of $t_{FAW}$ and $t_{RTRS}$ simultaneously. The CPRH memory scheduling approach relies on the basic principle of round robin access rotation through all of the banks in a multi-rank memory system. The CPRH algorithm superficially resembles the simpler alternating rank scheduling illustrated in FIG. 2 in that each row activation command is followed immediately by a column access command. However, unlike the alternating rank scheduling where each column command is a posted CAS command that immediately follows the row activation command to the same bank, the column command issued in the command pair algorithm is issued to a different bank of DRAM arrays. In essence, the command pair algorithm according to the present disclosure decouples the row-activation command and the column access commands to create the regular scheduling pair of row and column commands that mimic the command pairs found in basic DDRx SDRAM command scheduling algorithms.

Figure 3:
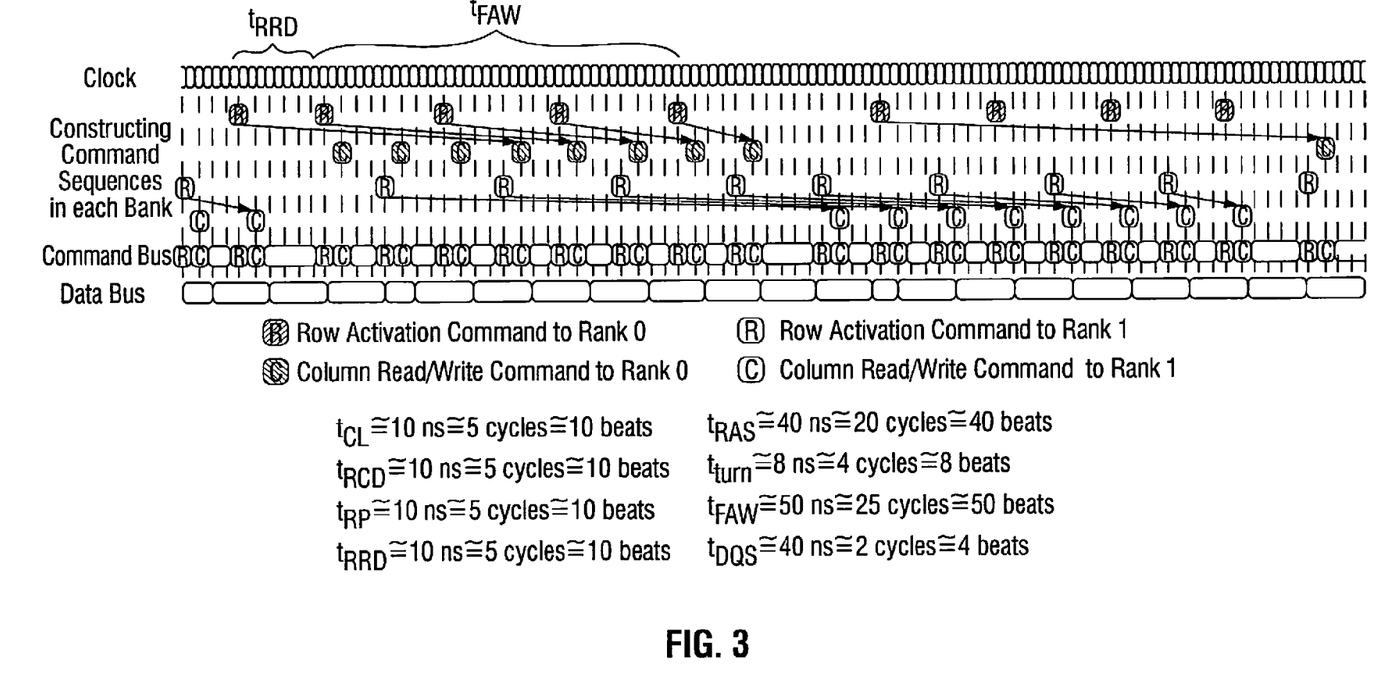
FIG. 3 illustrates a paired row and column command scheduling algorithm at 1 Gbps.

The command ordering sequence for the CPRH scheduling algorithm can be constructed from the basis of a round robin rotation through the banks. That is, DRAM column accesses are scheduled to bank 0, bank 1, bank 2, and rotated through sequentially to the $(N-1)^{th}$ bank of a given rank of memory, where N is the number of banks in a given rank of DRAM devices. The algorithm then switches to bank 0 of the alternate rank of memory and the process repeats itself in rotating through all banks in a two rank memory system. Thereafter, working backwards from the respective column access commands, the row access commands are scheduled to each rank in alternate ordering. FIG. 3 illustrates the construction and timing of the CPRH algorithm for a memory system with two ranks of 1 Gbps DDR3 SDRAM devices. FIG. 3 shows that the CPRH algorithm achieves high bandwidth in a two rank DDR3 SDRAM memory system despite the constraints imposed on the memory system by $t_{RRD}$, $t_{FAW}$ and $t_{RTRS}$.

The DRAM command sequence for the command pair scheduling algorithm is summarized by FIG. 4a. FIG. 4a shows that while the column access commands are group-scheduled successively to each bank in a given rank of memory, the row-activation commands are alternately scheduled to different ranks of memory. In the DRAM command sequence shown in FIGS. 3 and 4a, the command pair algorithm amortizes the rank switching cost of $t_{RTRS}$ and achieves the theoretical maximum sustainable bandwidth. FIGS. 3 and 4a also reveal a subtle optimization to the command pair algorithm; that is, row activations do not need to strictly alternate between different ranks. FIG. 4a shows a sequence that begins with a column access rank switch overlapped with two row activations to the same rank. In this case, the rank-switching overhead of $t_{RTRS}$ increases the minimum scheduling distance between two row activation commands, and the $t_{RRD}$ row activation constraint does not expose additional latency in the scheduling of DRAM commands in the memory system.

The command pair scheduling algorithm according to the present disclosure is provided in a programmable sequence (e.g., programmable instructions) capable of being executed by at least one memory controller 300 (FIG. 4b) associated with a multi-rank DDRx SDRAM memory system 200 for performing command scheduling for row access commands and column access commands in accordance with the present disclosure in order to provide a technical effect.

That is, the at least one memory controller 300 executes the programmable sequence indicative of the command pair scheduling algorithm according to the present disclosure for performing command scheduling for row access commands and column access commands by decoupling the row access commands from the column access commands; alternatively scheduling the decoupled row access commands to the different ranks of memory; and group scheduling the decoupled column access commands to each bank of the number of banks of a given rank of at least two different ranks of memory. The scheduling step further includes switching to an alternate rank of the two different ranks of memory; and scheduling the column access commands sequentially to each of the number of banks of the alternate rank of at least two different ranks of memory. The alternatively scheduling step also provides some flexibility for scheduling the decoupled column access commands to different ranks of memory, if following the first decoupled row access command there is a switch in rank from a first rank of the two different ranks of memory to a second rank of the two different ranks of memory for a subsequent column access command.

The programmable sequence can be stored as a set of programmable instructions on a computer-readable medium, such as a CD-ROM, hard drive, diskette, memory card, portable memory adapter, ROM, EPROM, EEPROM, etc.

C. Summary of the Rank Hopping Algorithm

Power consumption and heat dissipation considerations are constraining high performance DRAM memory systems just as they are constraining high performance processors. The combination of power limitation and data bus synchronization constraints limits available memory bandwidth in DDR2 and future DDR3 SDRAM memory systems that do not adequately account for these bandwidth constraints. The DRAM command-scheduling algorithm according to the present disclosure maximizes sustainable bandwidth of the memory system while operating within power and system synchronization constraints of DDR2 and DDR3 SDRAM devices.

Two current and ongoing trends ensure that the scheduling algorithm according to the present disclosure will become even more important as process scaling continues in the future. The first trend that favors the scaling algorithm according to the present disclosure is that as processor frequencies and DRAM device data rates increase, the power limitation constraints will become even more confining—row activations must be scheduled farther apart from each other in terms of number of cycles. The scheduling algorithm according to the present disclosure alleviates this power constraint by allowing the row activation commands to be scheduled farther apart in a given rank without impacting the scalability of maximum bandwidth efficiency as long as $t_{RRD}$ does not exceed $2*t_{Burst}$, or $t_{FAW}$ does not exceed $8*t_{Burst}$.

The second trend that favors the scheduling algorithm according to the present disclosure is that as transistor budgets continue to grow, the trend toward multi-threaded cores and chip-level multiprocessors appears to be inevitable. Memory request streams from these processors will have higher access rates and less spatial locality compared to memory request streams from traditional uniprocessor systems. The higher access rate will require more bandwidth per pin from the memory system, and the decreased spatial locality property means an increase in the number of row cycles per transaction, even in open-page DRAM memory systems. Both effects of the multi-threaded and multi-processor system increase the importance of a close-page, bandwidth optimized DRAM transaction and command scheduling algorithms such as the algorithm according to the present disclosure.

D. Isomorphism

Figure 5:
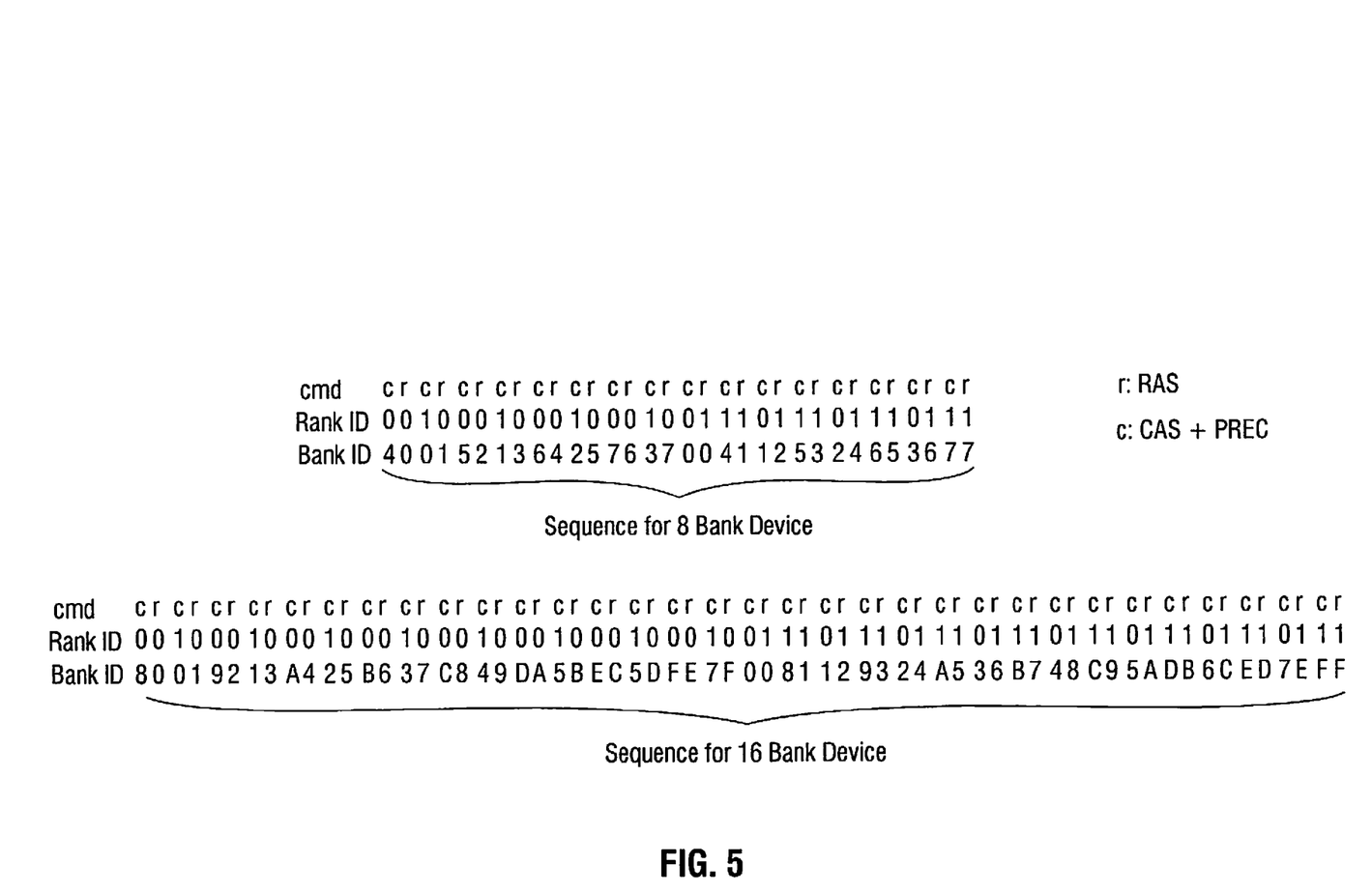
FIG. 5 illustrates two row and column command sequences for a two rank, eight banks per rank memory system and a two rank, sixteen banks per rank memory system, respectively, generated by implementation of a rank hopping algorithm in accordance with the present disclosure.

The scheduling algorithm described herein is illustrated by a sequence shown in FIG. 4a. One skilled in the art can appreciate that the sequence shown by FIG. 4a is not the only possible sequence due to the implementation of the rank hopping scheduling algorithm in accordance with the present disclosure. FIG. 5 illustrates two additional sequences due to the implementation of the rank hopping scheduling algorithm described herein. The top sequence in FIG. 5 shows a slight variation in the sequence from the sequence shown in FIG. 4a for a two rank, eight banks per rank memory system, and the bottom sequence corresponds to implementation of the rank hopping algorithm in a two rank, sixteen banks per rank memory system. These sequences are isomorphic in terms of implementation of the scheduling algorithm, but specific sequences can be optimized to obtain better latency characteristics or better respect the priority of the individual requests.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. In a multi-rank DDRx memory system having at least two ranks of memory each having a number of banks, where x is an integer greater than or equal to 2, a method for performing command scheduling for row access commands and column access commands, said method comprising:
   decoupling the row access commands from adjacent column access commands, including scheduling adjacent row and column access commands to access different banks;
   scheduling the decoupled row access commands to alternating ranks of the at least two ranks of memory, including scheduling each decoupled row access command based on the rank accessed by the previous row access command for the scheduled decoupled row access command to access a different rank than the previous row access command;
   group scheduling the decoupled column access commands to each bank of the number of banks of a given rank of the different ranks of the at least two ranks of memory, including scheduling each decoupled column access command based on the rank accessed by the previous column access command for the decoupled access command to access another bank of the rank accessed by the previous column access command until there are no more column access commands that access banks of the given rank available for scheduling.

2. The method according to claim 1, wherein the group scheduling step further comprises:
   switching to an alternate rank of the different ranks of the at least two ranks of memory; and
   scheduling the column access commands sequentially to each of the number of banks of the alternate rank of the different ranks of the at least two ranks of memory.

3. The method according to claim 2, wherein the scheduling the decoupled row access commands step provides for consecutively scheduling first and second decoupled row access commands to an identical rank of the different ranks of the at least two ranks of memory, if following the first decoupled row access command there is a switch in rank from a first rank of the different ranks of the at least two ranks of memory to a second rank of the different ranks of the at least two ranks of memory for a subsequent column access command.

4. The method according to claim 1, wherein the method increases the maximum bandwidth efficiency for the multi-rank DDRx memory system to $B*t_{Burst}/(B*t_{Burst}+t_{RTRS})$, where B denotes the number of banks, $t_{Burst}$ denotes a time period that a data burst occupies a data bus of the DDRx memory system, and $t_{RTRS}$ denotes a data strobe turnaround time period.

5. The method according to claim 1, wherein each scheduled row access command is paired with a scheduled column access command, and the commands in every pair of row and column access commands are decoupled.

6. A multi-rank DDRx memory system comprising at least two ranks of memory each having a number of banks, where x is an integer greater than or equal to 2 and, and at least one memory controller configured for executing a programmable sequence for performing the controller-implemented step of command scheduling for row access commands and column access commands, wherein each scheduled row access command is paired with a consecutively scheduled column access command, said command scheduling step comprising:
   decoupling the row access commands from paired column access commands, including scheduling paired row and column access commands to access different banks;
   scheduling the decoupled row access commands to alternating ranks of the at least two ranks of memory alternating ranks of the at least two ranks of memory, including scheduling each decoupled row access command based on the rank accessed by the previous row access command for the scheduled decoupled row access command to access a different rank than the previous row access command; and
   group scheduling the decoupled column access commands to each bank of the number of banks of a given rank of the different ranks of the at least two ranks of memory, including scheduling each decoupled column access command based on the rank accessed by the previous column access command for the decoupled access command to access another bank of the rank accessed by the previous column access command until there are no more column access commands that access banks of the given rank available for scheduling.

7. The memory system according to claim 6, wherein the group scheduling step further comprises:
   switching to an alternate rank of the different ranks of the at least two ranks of memory; and
   scheduling the column access commands sequentially to each of the number of banks of the alternate rank of the different ranks of the at least two ranks of memory.

8. The memory system according to claim 7, wherein the scheduling the decoupled row access commands step provides for consecutively scheduling first and second decoupled row access commands to an identical rank of the different ranks of the at least two ranks of memory, if following the first decoupled row access command there is a switch in rank from a first rank of the different ranks of the at least two ranks of memory to a second rank of the different ranks of the at least two ranks of memory for a subsequent column access command.

9. The memory system according to claim 6, wherein the method increases the maximum bandwidth efficiency for the multi-rank DDRx memory system to $B*t_{Burst}/(B*t_{Burst+tRTRS})$, where B denotes the number of banks, $t_{Burst}$ denotes a time period that a data burst occupies a data bus of the DDRx memory system, and $t_{RTRS}$ denotes a data strobe turnaround time period.

10. A computer readable medium storing a programmable sequence capable of being executed by at least one memory controller for performing the method of command scheduling for row access commands and column access commands in a multi-rank DDRx memory system, where x is an integer greater than or equal to 2, said method comprising:

decoupling the row access commands from adjacent column access commands, including scheduling adjacent row and column access commands to access different banks;

scheduling the decoupled row access commands to alternating ranks of memory of the multi-rank DDRx memory system, including scheduling each decoupled row access command based on the rank accessed by the previous row access command for the scheduled decoupled row access command to access a different rank than the previous row access command; and     group scheduling the decoupled column access commands to each bank of the number of banks of a given rank of the different ranks of memory, including scheduling each decoupled column access command based on the rank accessed by the previous column access command for the decoupled access command to access another bank of the rank accessed by the previous column access command until there are no more column access commands that access banks of the given rank available for scheduling.

11. The computer readable medium according to claim 10, wherein the group scheduling step further comprises:

switching to an alternate rank of the different ranks of memory; and     scheduling the column access commands sequentially to each of the number of banks of the alternate rank of the different ranks of memory.

12. The computer readable medium according to claim 11, wherein the scheduling the decoupled row access commands step provides for consecutively scheduling first and second decoupled row access commands to an identical rank of the different ranks of memory, if following the first decoupled row access command there is a switch in rank from a first rank of the different ranks of memory to a second rank of the different ranks of memory for a subsequent column access command.

13. The computer readable medium according to claim 10, wherein the method increases the maximum bandwidth efficiency for the multi-rank DDRx memory system to $B*t_{Burst}/(B*t_{Burst+tRTRS})$, where B denotes the number of banks, $t_{Burst}$ denotes a time period that a data burst occupies a data bus of the DDRx memory system, and $t_{RTRS}$ denotes a data strobe turnaround time period.

14. In a multi-rank DDRx memory system having at least two ranks of memory each having a number of banks, where x is an integer greater than or equal to 2, a command sequence pattern formed by performing command scheduling of row access commands and column access commands using the method of:

decoupling the row access commands from adjacent column access commands, including scheduling adjacent row and column access commands to access different banks;

scheduling the decoupled row access commands to alternating ranks of memory, including scheduling each decoupled row access command based on the rank accessed by the previous row access command for the scheduled decoupled row access command to access a different rank than the previous row access command; and     group scheduling the decoupled column access commands to each bank of the number of banks of a given rank of the different ranks of memory, including scheduling each decoupled column access command based on the rank accessed by the previous column access command for the decoupled access command to access another bank of the rank accessed by the previous column access command until there are no more column access commands that access banks of the given rank available for scheduling.

15. The command sequence pattern according to claim 14, wherein the group scheduling step further comprises:

switching to an alternate rank of the different ranks of memory; and     scheduling the column access commands sequentially to each of the number of banks of the alternate rank of the different ranks of memory.

16. The command sequence pattern according to claim 15, wherein the scheduling the decoupled row access commands step provides for consecutively scheduling first and second decoupled row access commands to an identical rank of the different ranks of memory, if following the first decoupled row access command there is a switch in rank from a first rank of the different ranks of memory to a second rank of the different ranks of memory for a subsequent column access command.

17. The command sequence pattern according to claim 14, wherein the method increases the maximum bandwidth efficiency for the multi-rank DDRx memory system to $B*t_{Burst}/(B*t_{Burst+tRTRS})$, where B denotes the number of banks, $t_{Burst}$ denotes a time period that a data burst occupies a data bus of the DDRx memory system, and $t_{RTRS}$ denotes a data strobe turnaround time period.

\* \* \* \* \*